(12) United States Patent
Graham

(10) Patent No.: US 8,044,744 B2
(45) Date of Patent: Oct. 25, 2011

(54) TIME MODULATION WITH COSINE FUNCTION

(75) Inventor: Martin H. Graham, Berkeley, CA (US)

(73) Assignee: And Yet, Inc., Berkeley, CA (US)

( * ) Notice: Subject to any disclaimer, the term of this patent is extended or adjusted under 35 U.S.C. 154(b) by 469 days.

(21) Appl. No.: 12/221,274

(22) Filed: Aug. 1, 2008

(65) Prior Publication Data

US 2009/0066435 A1   Mar. 12, 2009

(51) Int. Cl.
*H03K 7/04* (2006.01)
*H03K 7/08* (2006.01)
*H03K 9/04* (2006.01)
*H03K 9/08* (2006.01)

(52) U.S. Cl. ........ 332/112; 332/109; 329/313; 329/312; 375/239; 375/238

(58) Field of Classification Search .......... 332/106, 332/112, 185, 144; 375/219, 222, 223, 239, 375/295, 302, 316, 320, 340, 238; 329/311, 329/313, 345, 372, 312
See application file for complete search history.

(56) References Cited

U.S. PATENT DOCUMENTS

| | | | | |
|---|---|---|---|---|
| 5,332,975 A | * | 7/1994 | Young et al. | 327/107 |
| 5,696,790 A | | 12/1997 | Graham et al. | |
| 6,678,321 B1 | * | 1/2004 | Graham et al. | 375/238 |

OTHER PUBLICATIONS

Graham, Martin H. "Biphase Multiple Level Communications," U.S. Appl. No. 09/221,291, filed Dec. 23, 1998.
Shannon, C.E. "A Mathematical Theory of Communication," *Bell System Technical Journal*, vol. 27, pp. 379-423 and 623-656, Jul. and Oct. 1948.

* cited by examiner

*Primary Examiner* — Ryan Johnson
(74) *Attorney, Agent, or Firm* — Blakely, Sokoloff, Taylor & Zafman, LLP

(57) ABSTRACT

A method and apparatus is described for a time modulated signal. A cosine function is used as the basis for the signal with time intervals at the maximum and minimum values of the cosine function defining the encoded data. The received waveform is twice differentiated to provide a cosine function from which zero crossings are detected and the time intervals determined.

9 Claims, 4 Drawing Sheets

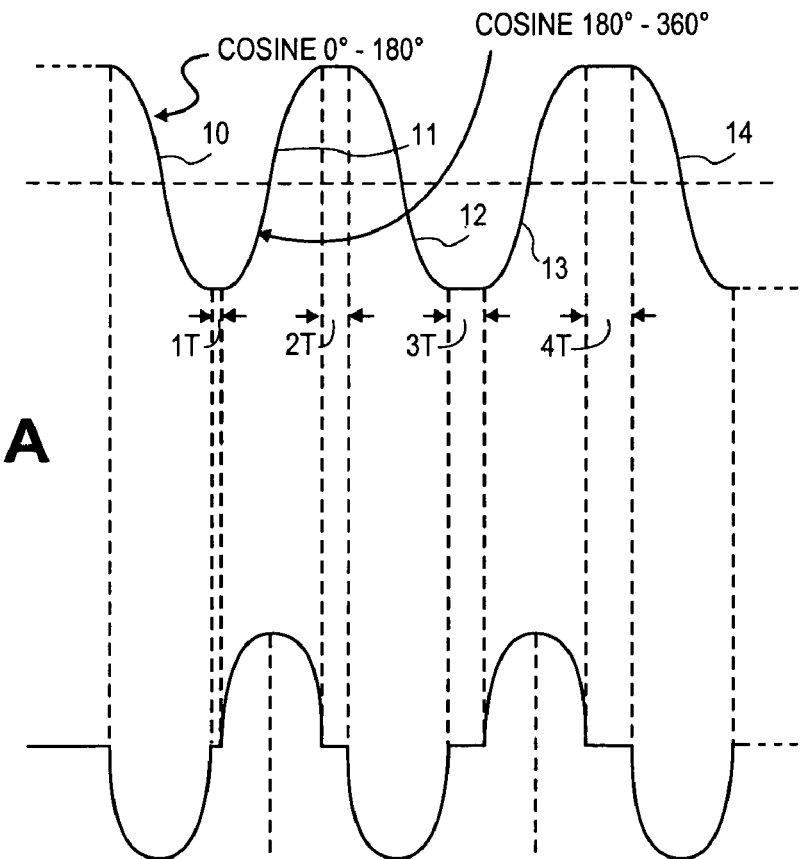
FIG. 1A
FIG. 1B
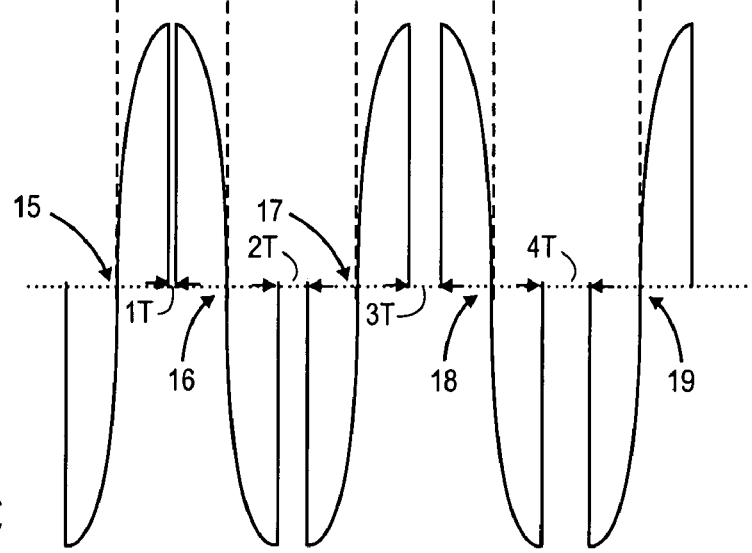
FIG. 1C ically obscure the present invention.
TIME MODULATION WITH COSINE FUNCTION

FIELD OF THE INVENTION

The field is information carrying time modulated signals.

PRIOR ART

Information is often conveyed on electrical signals through amplitude modulation and frequency modulation. Another method for encoding information in a signal described in U.S. Pat. No. 5,696,790 is referred to as time modulation. Here, the time between zero crossings of a signal represent a plurality of bits. In a subsequently filed application, Ser. No. 09/221, 291, filed Dec. 23, 1998, and entitled "Biphase Multiple Level Communication," the zero crossings are indicated by alternating biphasic pulses.

Time modulation has advantages in some environments and, in fact may, under some circumstances, exceed the Shannon limit (See C. E. Shannon, "A Mathematical Theory of Communication," *Bell Systems Technical Journal*, Vol. 27, pp. 379-423 and 623-656 July, October, 1948). This is possible since the Shannon limit is based upon additive white Gussian noise. In time modulation such noise is orthogonal to information carrying component of the signal.

SUMMARY OF THE INVENTION

A method is described for providing a time modulated signal where intervals between waveforms represent a plurality of bits. A first waveform is generated approximating a cosine waveform from 0° to 180°. Then, a first time interval occurs representing a first plurality of bits. This is followed by the generation of a second waveform approximating a cosine function from 180° to 360°. A second time interval occurs representing a second plurality of bits. Now, the first waveform is again generated, and a third time interval occurs representing a third plurality of bits. Following this, the second waveform is again generated. This process is continued allowing the generation of a time modulated signal.

In one embodiment, a circuit for providing the time modulated signal comprises a first set of serially coupled shift register stages and a plurality of resistors, each coupled to a stage of the register. The resistors are coupled to a common node. Each resistor is weighted such that when a 1 or 0 is shifted along the register, a cosine function is generated. A second set of serially coupled shift register stages, which are coupled to the first stages, are each coupled to a switch. The switches provide an input to the first stage of the first set of stages. The timing of the intervals between the cosine functions is provided by the second set of shift register stages and the switches. Data is decoded and used to activate one of the switches.

BRIEF DESCRIPTION OF THE DRAWINGS

FIG. 1A illustrates a time modulated signal in accordance with one embodiment of the present invention.

FIG. 1B illustrates the waveform of FIG. 1A after the signal is differentiated.

FIG. 1C represents the signal of FIG. 1B following a second differentiation.

DETAILED DESCRIPTION

Figure 2:
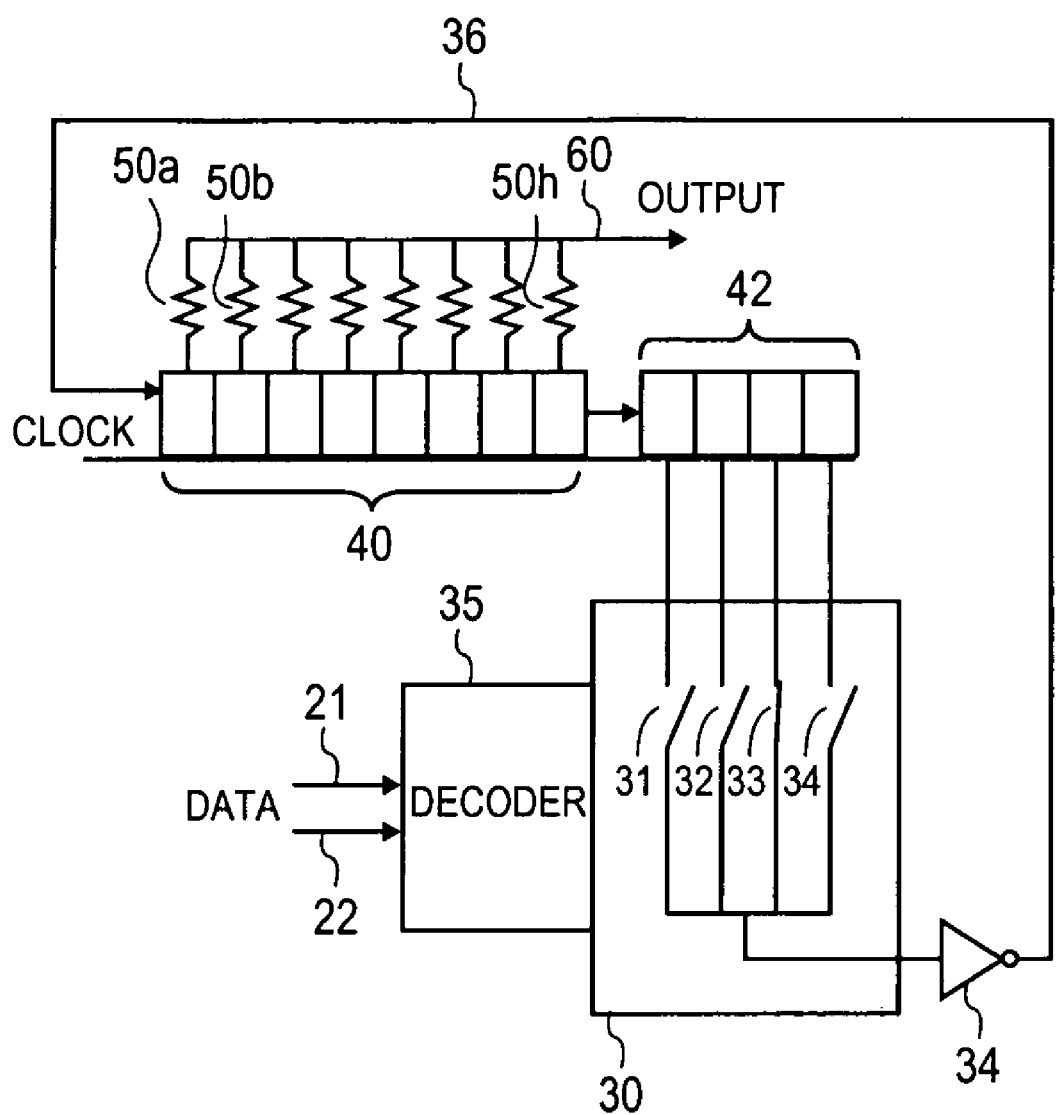
FIG. 2 is a circuit diagram of a circuit for encoding data to provide the waveform of FIG. 1A.

In the following description, numerous specific details are described, such as the shift register of FIG. 2 for generating an approximation of a cosine function. It will be apparent to one skilled in the art that the present invention may be practiced without these specific details. In other instances, well-known circuit functions are shown in block diagram form in order not to unnecessarily obscure the present invention.

Referring first to FIG. 1A, the illustrated waveform comprises a cosine function with time-wise extended peaks (both at 0° and 180°). Extended peaks (sometimes also referred to as intervals) are shown as 1 T, 2 T, 3 T and 4 T and each such interval represent data. Specifically, a first waveform is generated representing a half cycle of a cosine function (from 0° to 180°), as shown by 10 in FIG. 1A, followed by an interval representing a first plurality of bits (having a period of 1 T). Then a second waveform is generated comprising a cosine function from approximately 180° to 360° followed by a second interval, 2 T, representing a second plurality of bits. Now, another half cosine half cycle is generated (from 0° and 180°) as shown by waveform 12, followed by an interval of 3 T, representing a third plurality of bits. Following this, another half cycle cosine function 15 is generated. This is followed by an interval 4 T representing a fourth plurality of bits. Another half cycle cosine function 14 is shown. In practice, the illustrated signal of FIG. 1A continues with its half cycles of cosine functions and intervals dictated by the data which is to be encoded for transmission.

For the illustrated example, each of the waiting periods at the positive and negative peaks of the cosine wave represents a plurality of bits. As shown in FIG. 1A, the period 1 T represents the bits 00, 2 T the bits 01, 3 T the bits 10, and 4 T to the bits 11. Thus, for the illustrated example of FIG. 1A with its sequence of intervals 1 T, 2 T, 3 T, 4 T, the encoded data, as shown, is 000011011.

In another embodiment, T may vary from one to eight intervals, allowing each of 8 time intervals to represent 3 bits. Any number of intervals may be used. Moreover, while T=0 is not used in the illustrated example, it may be used.

To decode the encoded signal of FIG. 1A, the signal is differentiated twice. FIG. 1B shows the first differentiation of the signal of FIG. 1A. The derivative of a cosine function is a minus sine function, as shown in FIG. 1B. The effect of this differentiation is to reduce the low frequency noise.

Next, there is a second differentiation as shown in FIG. 1C before the zero crossing detection. The negative sine function waveforms of FIG. 1B, after being differentiated a second time, become the negative cosine function shown in FIG. 1C. Consequently, after the second differentiation, the signal is again a cosine function, albeit negative from the signal of FIG. 1A. The second differentiation also has the effect of further reducing the low frequency noise. Thus, the remarkable quality of the cosine function, that is a double differentiation, yields the inverse of the original signal, is put to use here to prepare the encoded signal for decoding.

To recover data after the second differentiation, zero crossings of the signal are detected. These crossings are shown in FIG. 1C as 15 through 19. The time between the crossings is determined, for instance, the time between the crossings 15 and 16 is 9 T. This time, in this embodiment represents the bits 00, 8 T of this interval is for the half cycle cosine functions. The remaining 1 T corresponds to the encoded data. Similarly there are 10 T intervals between the zero crossings 16 and 17.

Again considering the 8 T for the cosine functions, this leaves 2 T corresponding to the binary bits 01 as shown in FIG. 1A. Similarly, the zero crossings 17 and 18 leave 3 T, after accounting for the cosine function, and this corresponds to the bits 10. Lastly, the zero crossings 18 and 19 have 12 T intervals between them, corresponding to the encoding of the bits represented by 4 T, specifically 11.

Both the encoding and decoding shown in FIGS. 1A, 1B and 1C can be done either in the digital domain or in the analog domain or some combination thereof.

FIG. 2 is a circuit for providing the signal of FIG. 1A. It includes 8 shift register stages 40 and 4 shift register stages 42. While these are shown as separate shift registers to facilitate an explanation of the circuit, they may be a single 12-bit shift register. The stages 40 generate the cosine waveform, both for the approximately 0°-180° and approximately 180°-360°. Stages 42 provide the 1 T, 2 T, 3 T and 4 T intervals. Line 36 from inverter 34 is an input to the first stage of the stages 40. The last stage of the stages 40 provides an input to the first stage of the stages 42. A clock signal clocks all the stages 40 and 42 at a frequency of $$\frac{1}{T}.$$

Each of the stages of the shift register 42 are coupled to one terminal of switches 31, 32, 33 and 34 of the multiplexer 30. The other terminals of the switches 31, 32, 33 and 34 are coupled to inverter 34.

The decoder 35 receives the input data, two bits at a time, on lines 21 and 22. Decoder 35 simply decodes the data to provide one of four output signals representing the periods 1 T, 2 T, 3 T and 4 T. These four decoder output signals each cause one of the switches 31, 32, 33 and 34 to close. Thus, if the input data on lines 21 and 22 are bits 00, decoder 20 provides a signal that closes switch 31 and, as will be seen, provide an interval of 1 T to occur between the half cosine functions. Similarly, if the input data are bits 01 a signal is provided to close switch 32, bits 10 close switch 33 and bits 11 close switch 34. The switches and decoder, together are commercially available as, for example, Part No. HC 4052 or HC 4053 from National Semiconductor.

Figure 3:
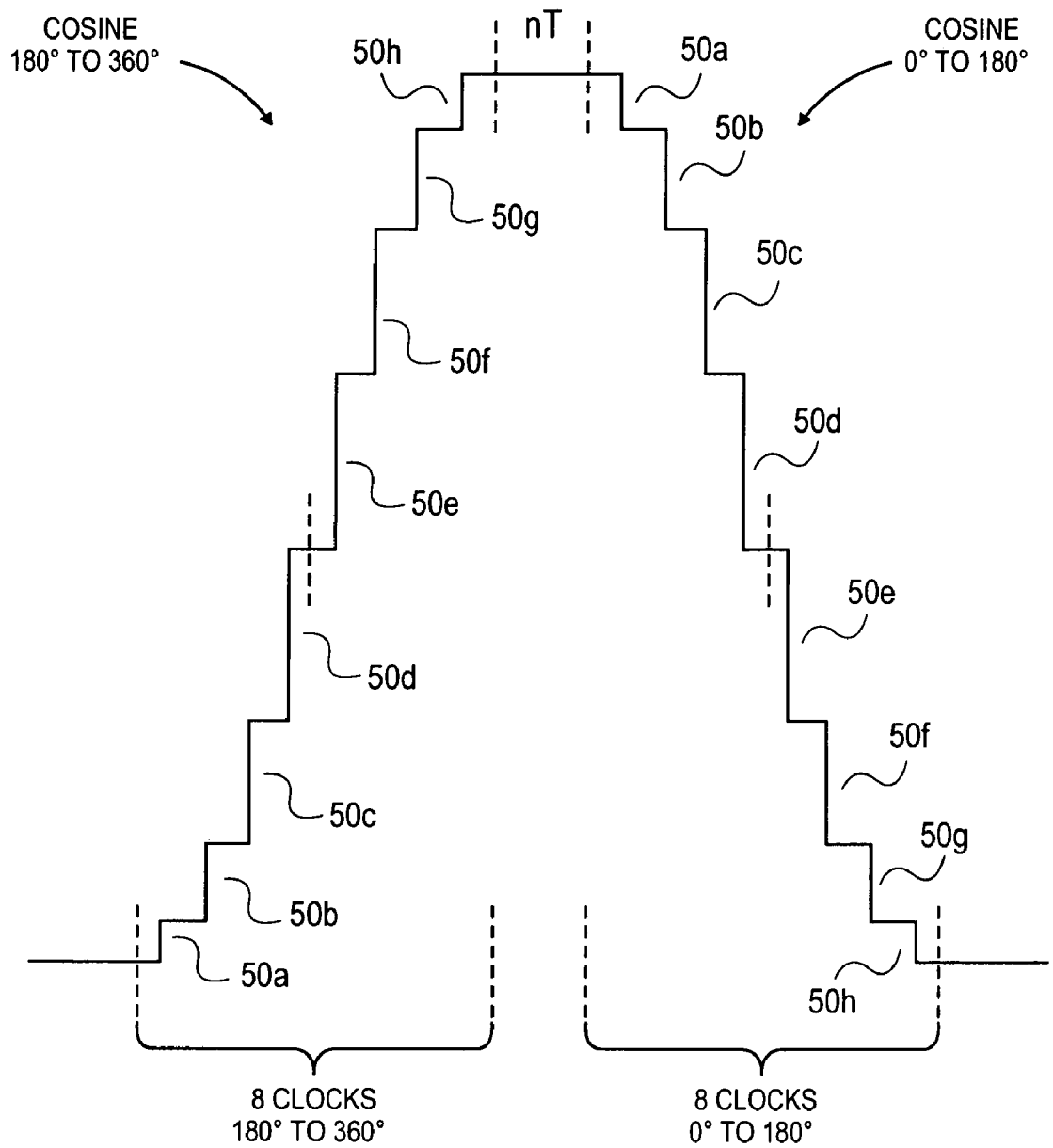
FIG. 3 shows a piecemeal generation of a signal approximating a cosine waveform.

For the embodiment of FIG. 2, the clock applied to the shift registers has a period equal to T. Moreover, each of the half cosine functions has a period equal to 8 T. The cosine wave is approximated by a piecemeal increase or decrease of the current applied to the output line 60. The resistors 50*a* through 50*h* are weighted to approximate the cosine functions as shown in FIG. 3.

Assume that all the stages 40 of the shift register contain a 0 and a 1 is applied to the input of the first stage of the shift register on line 36. This 1 first causes a current to flow through resistor 50*a*. After the next clock signal (T), the 1 from the first stage is moved to the second stage of the shift register, and another 1 is read into the first stages so that there is now a current from resistors 50*a* and 50*b*. This process continues as each of the resistors associated with each of the stages 40 receives the binary 1. The current on line 60 is increased with each clock pulse as shown in FIG. 3. The contribution from resistor 50*a* through 50*h* is shown for the rising cosine waveform. The piecemeal nature of this signal is diminished by passing the step-wise waveform through a high frequency filter which attenuates the high frequencies associated with the steps in the waveform. When the waveform of FIG. 4 reaches its peak, it remains there for some integral number of intervals T. For the described embodiment, this is either 1, 2, 3 or 4 intervals.

Figure 4:
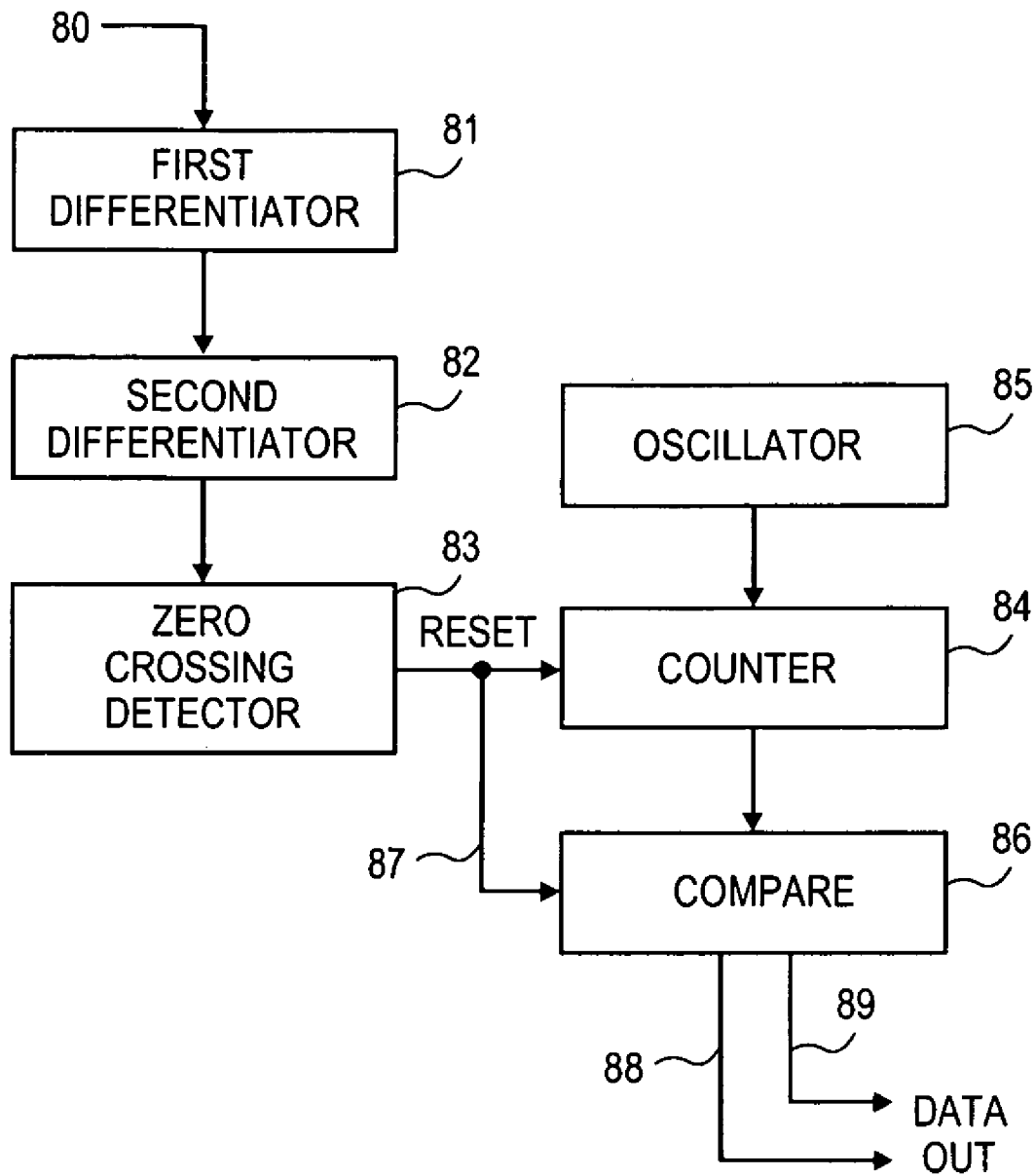
FIG. 4 is a block diagram illustrating a circuit for decoding a signal modulated in accordance with the present invention.

When the input to the shift register stages 40 changes from a 1 to a 0, a 0 is shifted through the stages. As the 1s are, one-by-one, removed from the stages and replaced with a 0, the waveform of FIG. 3 decreases as the current in line 60 is removed. First, the current associated with resistor 50*a* is removed followed by the current from resistor 50*b*, etc. This is shown in FIG. 4 by the decreasing waveform associated with the cosine function from 180° to 360°. Again, filtering is used to remove the high frequency components from this waveform.

The signal on line 60 from the resistors 50*a*-50*h* is biased so that when the stages 40 contain all 0s, the signal of line 60 is at its maximum negative amplitude. When the stages 40 contain all 1s the signal on line 60 is at its maximum positive amplitude. A zero crossing occurs when half the stages 40 have 1s and the other half have 1s.

Assume for purposes of understanding the operation of the circuit of FIG. 2, that initially all the stages of shift register 40 have 0s, thus providing a maximum negative cosine value on line 60. Further assume that the input data on lines 21 and 22 is bits 00. On the next clock, a zero is shifted in the first of the stages 42, however, when this occurs a 0 is still present at the output of inverter 34 and thus line 60 remains at its maximum negative value. Also at this time, switch 31 is closed, and on the next clock, the 0 in the first stage of stages 42 causes the output of inverter 34 to change to a 1. Now 1s are applied to the stages 40. This provides the half cosine function from approximately 180° to 360°.

Assume now that the data bits 01 are applied to lines 21 and 22 respectively, and as shown in FIG. 1, requiring a period of 2 T between the half cosine functions. (New data may be applied to lines 21 and 22, four periods T following a transition at inverter 34). This causes switch 32 is closed. At this time, there are all 0s in the stages 42. Thus, the signal on line 36 remains high. After 8 clocks, the cosine function from 0° to 180° is completed, and on the next clock, a 0 enters the first stage of the stages 42. Since switch 31 is open, there is no charge at the output of the inverter 34. After the next clock, the 0 is coupled by switch 32 to the first of the stages 42. Thus there is a 2 T interval at the maximum amplitude of the cosine function before it begins its descent.

In this manner, the data bits applied to lines 21 and 22 cause the appropriate intervals between the rise and fall of the half cycle cosine functions.

Referring to FIG. 4, a receiver for decoding the time modulated signal from FIG. 2 is shown. The signal on line 60 after, for instance, being transmitted over a network is received at the differentiator 81 on line 80. The differentiator 81 performs the differentiation to provide the signal of FIG. 1B. An ordinary RC network may be used for performing this differentiation. Then, the second differentiation occurs in the differentiator 82. This provides the signal of FIG. 1C, coupled to the zero crossing detector 83. Again, an ordinary RC circuit may be used for the differentiator 82. The zero crossing detector 83, which may use an ordinary Op Amp bias to detect the zero crossing of the signal, provides an output pulse to the counter 87 each time a zero crossing is detected. This pulse resets the counter 84. The counter 84, which may be an ordinary digital counter, counts at the frequency of $$f = \frac{2}{T}$$

or greater. An oscillator 85, which preferably is a crystal-controlled oscillator, causes the counter to count at the frequency of $$\frac{2}{T}$$

or greater. The count from the counter 84 is compared with predetermined ranges each time a zero crossing occurs, this occurs when the counter is reset.

For the described embodiment, assume $$f = \frac{4}{T},$$

then if there is perfect synchronization between the transmitted and receiver the counter is reset at the counts of 36, 40, 44 or 48. This corresponds to a count of 32"T" (where "T" in the receiver is equal to $$\frac{T}{4}$$

of the transmitter) of cosine function (90° to 270°) and (270° to 90°) between zero crossing. Added to this are the intervals 4×1 T, 4×2 T, 4×3 T and 4×4 T for the data signifying intervals. Since there is likely some slight error between the period T in the encoder of FIG. 2 versus the receiver of FIG. 4, a range of counts can be considered which compensates for this error. For instance, bits 00 may be considered to be a count of 36±1; bits 01, 40±1; bits 10, 44±1; and bits 11, 48±1.

Other circuits and methods may be used to generate the cosine waveform. For instance, a look up table may be used to look up cosine values, which are then converted to a digital signal using a digital-to-analog converter.

Thus, a method for providing a time modulated signal has been described along with circuits for encoding and decoding the signal. A cosine function is used for the basis of the time modulated signal.

What is claimed is:

1. A method for providing a time modulated signal where time intervals between waveforms represents a plurality of bits, comprising the steps of:
   generating a first waveform consisting approximately 0° to 180° of a cosine waveform;
   stopping the generation of the first waveform;
   waiting a first time interval representing a first plurality of bits; and
   generating a second waveform immediately following the first time interval consisting approximately 180° to 360° of a cosine waveform.

2. The method of claim 1, including the additional steps of:
   waiting a second time interval representing a second plurality of bits;
   generating the first waveform immediately following the second time interval;
   waiting a third time interval; and
   generating the second waveform immediately following the third time interval.

3. The method of claim 2, where the steps and the additional steps are repeated with time intervals each representing a plurality of bits.

4. The method of claim 3, including the step of transmitting the time modulated signal.

5. The method of claim 4, including receiving the time modulated signal.

6. The method of claim 5, including the steps of:
   twice differentiating the received time modulated signal to obtain received pulses;
   determining the time interval between the zero crossing of the received pulses; and
   correlating each of the time intervals between the received pulses with one of the plurality of bits.

7. A method comprising:
   receiving a signal comprising alternating first and second cosine waveforms where the first waveforms comprise approximately 0° to 180° of a cosine waveform and the second waveform comprise approximately 180° to 360° of a cosine waveform, the first and second waveforms being separated by a plurality of time intervals each interval representing a plurality of bits;
   twice differentiating the received signal; and
   determining the time intervals between the twice differentiated signal.

8. A method for demodulating a time modulated signal where time intervals between waveforms represents a plurality of bits, comprising the steps of:
   receiving a modulated signal having a first waveform consisting approximately 0° to 180° of a cosine waveform immediately followed by a first time interval representing a first plurality of bits; then immediately followed by a second waveform consisting approximately 180° to 360° of a cosine waveform;
   differentiating the modulated signal; and
   determining zero crossing following differentiating.

9. A circuit for providing a time modulated data signal comprising:
   a first set of serially coupled shift register stages;
   a plurality of resistors having one terminal coupled to each of the first set of shift register stages and the other terminals coupled to a common node;
   a second set of serially coupled shift register stages, the first stage of which receives an input from a last stage of the first set of shift register stages;
   a clock source for clocking the first set and second set of serially coupled shift register stages at a constant rate such that the common node of the plurality of resistors provides a waveform approximating a rising or falling cosine wave;
   a plurality of switches, each having one terminal coupled to one of the stages of the second set of shift register stages, second terminals of each switch being coupled to an input of a first stage of the first set of shift register stages; and
   a decoder for receiving data and for selecting one of the switches such that the data provides predetermined delays at approximately positive and negative peaks of the cosine wave.

* * * * *